(12) United States Patent
Terakawa

(10) Patent No.: US 8,049,101 B2
(45) Date of Patent: Nov. 1, 2011

(54) PHOTOVOLTAIC DEVICE

(75) Inventor: Akira Terakawa, Nara (JP)

(73) Assignee: Sanyo Electric Co., Ltd., Osaka (JP)

( * ) Notice: Subject to any disclaimer, the term of this patent is extended or adjusted under 35 U.S.C. 154(b) by 1011 days.

(21) Appl. No.: 11/237,788

(22) Filed: Sep. 29, 2005

(65) Prior Publication Data

US 2006/0065297 A1      Mar. 30, 2006

(30) Foreign Application Priority Data

Sep. 29, 2004   (JP) .................................. 2004-284569

(51) Int. Cl.
*H01L 31/042* (2006.01)

(52) U.S. Cl. ........................ 136/258; 136/243; 136/252

(58) Field of Classification Search ........... 136/243–265
See application file for complete search history.

(56) References Cited

U.S. PATENT DOCUMENTS

| | | | | |
|---|---|---|---|---|
| 4,612,559 A | * | 9/1986 | Hitotsuyanagi et al. | 136/258 |
| 5,514,506 A | * | 5/1996 | Takai et al. | 430/57.7 |
| 5,716,480 A | * | 2/1998 | Matsuyama et al. | 136/249 |
| 5,720,826 A | * | 2/1998 | Hayashi et al. | 136/249 |
| 6,124,545 A | * | 9/2000 | Bauer et al. | 136/255 |
| 2002/0069911 A1 | | 6/2002 | Nakamura et al. | |
| 2003/0168578 A1 | * | 9/2003 | Taguchi et al. | 250/214.1 |
| 2004/0182433 A1 | * | 9/2004 | Terakawa et al. | 136/255 |

FOREIGN PATENT DOCUMENTS

JP        2002-76409 A        3/2002

OTHER PUBLICATIONS

Japanese Office Action, with English translation, issued in Japanese Patent Application No. 2005-257818, mailed Aug. 4, 2009.

* cited by examiner

*Primary Examiner* — Keith Hendricks
*Assistant Examiner* — Bach Dinh
(74) *Attorney, Agent, or Firm* — McDermott Will & Emery LLP

(57) ABSTRACT

In the photovoltaic devices comprising a substantially intrinsic amorphous silicon layer containing hydrogen between an n-type single-crystal silicon substrate and a p-type amorphous silicon layer containing hydrogen, the photovoltaic device according to the present invention comprises a trap layer that contains less hydrogen than the intrinsic amorphous silicon layer between the p-type amorphous silicon layer and the intrinsic amorphous silicon layer. The trap layer reduces hydrogen diffusion from the intrinsic amorphous silicon layer to the p-type amorphous silicon layer.

3 Claims, 8 Drawing Sheets

PHOTOVOLTAIC DEVICE

The priority application Number JP2004-284569 upon which this patent application is based is hereby incorporated by reference.

BACKGROUND OF THE INVENTION

Field of the Invention

The present invention relates to a photovoltaic device having semiconductor heterojunctions.

Recently, considerable research has been done on solar cells, or photovoltaic devices, using crystalline semiconductors such as single-crystal silicon and multicrystalline silicon, and many photovoltaic devices have been put in practical use. In particular, solar cells having semiconductor heterojunctions formed by combining amorphous silicon and crystalline silicon receive attention for the junction that can be formed through a low-temperature process, at 200 degrees centigrade or lower, by a plasma CVD method and others, and for their high conversion efficiency. In order to further improve the photoelectric conversion efficiency, the photovoltaic device needs to improve fill factor (F.F.) as maintaining short-circuit current (Isc) and open-circuit voltage (Voc) high.

There have been developed solar cells having the so-called H.I.T. (Heterojunction with Intrinsic Thin-layer) structure in which a substantially intrinsic amorphous silicon layer (i-type amorphous silicon layer) containing hydrogen is interposed between an n-type single-crystal silicon substrate and a p-type amorphous silicon layer containing hydrogen. Some proposed solar cell devices having the H.I.T. structure include an i-type amorphous silicon layer with an optical band gap expanded on a side in contact with the p-type amorphous silicon layer in order to reduce the recombination of photo-generated carries and improve the photoelectric conversion efficiency (e.g. Japanese unexamined patent publication No. 2002-76409, U.S. patent application Ser. No. 09/947,317).

In a solar cell device having the H.I.T. structure, the p-type amorphous silicon layer disposed on a light incident side has an optimal composition of hydrogen concentration and p-type impurity dopant, such as boron (B), in consideration of conductivity and light-transmissivity. The i-type amorphous silicon layer also has an optimal composition of hydrogen concentration and others for the purpose of improvement of interfacial quality. In the conventional H.I.T. solar cell having the merely optimized p-type amorphous silicon layer and i-type amorphous silicon layer, the hydrogen concentration of the i-type amorphous silicon layer is higher than that of the p-type amorphous silicon layer.

By the way, any solar cells having amorphous silicon layers formed by a plasma CVD method deteriorate their output characteristics by a long application of heat at high temperatures of 200 degrees centigrade or more. For this reason, the formation of electrodes and lamination coating after the amorphous silicon layer is formed are performed while controlling temperature so as not to exceed the temperature in the CVD process.

SUMMARY OF THE INVENTION

The possible causes of the deterioration in output characteristics by heating at high temperatures are: (1) diffusion of electrode materials into doped amorphous semiconductor thin films containing hydrogen; (2) diffusion of the dopant into substantially intrinsic amorphous semiconductor thin-film layers; (3) diffusion of hydrogen; and others. Among these causes, the cause (3) affects the output characteristics the most at low temperatures.

Especially, the diffusion of hydrogen from an i-type amorphous silicon layer to a p-type amorphous silicon layer reduces activation rate of boron (B), which is a dopant, thereby decreasing a built-in electric field. As a result, the output characteristics of the solar cell are deteriorated, which is a problem.

The present invention was made in view of the above problem, and has an object to reduce the deterioration of the output characteristics of the solar cells suffered during the heating processes after the amorphous semiconductor thin-film layer is formed by the plasma CVD method.

A photovoltaic device according to the present invention includes a crystalline semiconductor substrate, a substantially intrinsic amorphous semiconductor thin-film layer containing hydrogen and provided on the crystalline semiconductor substrate, a doped amorphous semiconductor thin-film layer containing hydrogen and provided on the intrinsic amorphous semiconductor thin-film layer, and a hydrogen-diffusion reducing area provided between the doped amorphous semiconductor thin-film layer and the intrinsic amorphous semiconductor thin-film layer and reducing hydrogen diffusion from the intrinsic amorphous semiconductor thin-film layer to the doped amorphous semiconductor thin-film layer.

As described above, the present invention can reduce the hydrogen diffusion from the intrinsic amorphous semiconductor thin-film layer to the doped amorphous semiconductor thin-film layer by the use of the hydrogen-diffusion reducing area. Consequently, the deterioration in the output characteristics of the solar cell suffered during the heating processes after the formation of the amorphous semiconductor thin-film layer can be reduced.

The hydrogen-diffusion reducing area is an area formed in the vicinity of an interface between the doped amorphous semiconductor thin-film layer and the intrinsic amorphous semiconductor thin-film layer, and containing higher concentrations of hydrogen than the intrinsic amorphous semiconductor thin-film layer does.

As described above, the hydrogen-diffusion reducing area can be formed by containing more hydrogen than the intrinsic amorphous semiconductor thin-film layer does. The area with the high concentrations of hydrogen can reduce the hydrogen diffusion from the intrinsic amorphous semiconductor thin-film layer to the doped amorphous semiconductor thin-film layer.

In addition, the hydrogen-diffusion reducing area is an area formed in the vicinity of the interface between the doped amorphous semiconductor thin-film layer and the intrinsic amorphous semiconductor thin-film layer, containing higher concentrations of hydrogen than the intrinsic amorphous semiconductor thin-film layer does, and doped with the same type of impurity as that for the doped amorphous semiconductor thin-film layer.

As described above, the hydrogen-diffusion reducing area can be formed by containing more hydrogen than the intrinsic amorphous semiconductor thin-film layer does and doping the same type of impurity as that for the doped amorphous semiconductor thin-film layer. The area can reduce the hydrogen diffusion from the intrinsic amorphous semiconductor thin-film layer to the doped amorphous semiconductor thin-film layer.

Furthermore, the hydrogen-diffusion reducing area is a trap layer formed in the vicinity of the interface between the doped amorphous semiconductor thin-film layer and the intrinsic amorphous semiconductor thin-film layer and containing lower concentrations of hydrogen than the intrinsic amorphous semiconductor thin-film layer does.

As described above, the hydrogen-diffusion reducing area can be formed by providing the trap layer containing less hydrogen than the intrinsic amorphous semiconductor thin-film layer does. The trap layer can reduce the hydrogen diffusion from the intrinsic amorphous semiconductor thin-film layer to the doped amorphous semiconductor thin-film layer.

The trap layer may be a substantially intrinsic amorphous semiconductor thin-film layer.

The trap layer may be doped with the same type of impurity as that for the doped amorphous semiconductor thin-film layer.

A photovoltaic device according to the present invention is characterized by including an n-type single-crystal silicon substrate, a substantially intrinsic amorphous silicon layer containing hydrogen and provided on the single-crystal silicon substrate, a p-type amorphous silicon layer containing hydrogen and provided on the intrinsic amorphous silicon layer, and a hydrogen-diffusion reducing area provided between the p-type amorphous silicon layer and the intrinsic amorphous silicon layer and reducing hydrogen diffusion from the intrinsic amorphous silicon layer to the p-type amorphous silicon layer.

As described above, the present invention can reduce the hydrogen diffusion from the intrinsic amorphous silicon layer to the p-type amorphous silicon layer by the use of the hydrogen-diffusion reducing area. Consequently, the deterioration in the output characteristics of the solar cell suffered during the heating processes after the formation of the amorphous semiconductor thin-film layer can be reduced.

The hydrogen-diffusion reducing area is an area formed in the vicinity of an interface between the p-type amorphous silicon layer and the intrinsic amorphous silicon layer and containing higher concentrations of hydrogen than the intrinsic amorphous silicon layer does.

As described above, the hydrogen-diffusion reducing area can be formed by containing more hydrogen than the intrinsic amorphous silicon layer does. The area with the high concentrations of hydrogen can reduce hydrogen diffusion from the intrinsic amorphous silicon layer to the p-type amorphous silicon layer.

In addition, the hydrogen-diffusion reducing area is an area formed in the vicinity of the interface between the p-type amorphous silicon layer and the intrinsic amorphous silicon layer, containing higher concentrations of hydrogen than the intrinsic amorphous silicon layer does, and doped with a p-type impurity.

As described above, the hydrogen-diffusion reducing area can be formed by containing more hydrogen than the intrinsic amorphous silicon layer does and doping the p-type impurity. The area can reduce hydrogen diffusion from the intrinsic amorphous silicon layer to the p-type amorphous silicon layer.

Furthermore, the hydrogen-diffusion reducing area is a trap layer formed in the vicinity of the interface between the p-type amorphous silicon layer and the intrinsic amorphous silicon layer and containing lower concentrations of hydrogen than the intrinsic amorphous silicon layer does.

As described above, the hydrogen-diffusion reducing area can be formed by providing the trap layer containing less hydrogen than the intrinsic amorphous silicon layer does. The trap layer can reduce hydrogen diffusion from the intrinsic amorphous silicon layer to the p-type amorphous silicon layer.

The trap layer may be a substantially intrinsic amorphous silicon layer. In this case, the thickness of the trap layer should be from 1 nm to 5 nm, more preferably 1 nm to 2 nm.

The trap layer may be an amorphous silicon layer doped with the p-type impurity. In this case, the thickness of the trap layer should be 0.1 nm or more but less than 3 nm, more preferably 0.3 nm to 2 nm.

The foregoing and other objects, features, aspects and advantages of the present invention will become more apparent from the following detailed description of the present invention when reviewed in conjunction with the accompanying drawings.

DETAILED DESCRIPTION OF THE PREFERRED EMBODIMENTS

Figure 1:
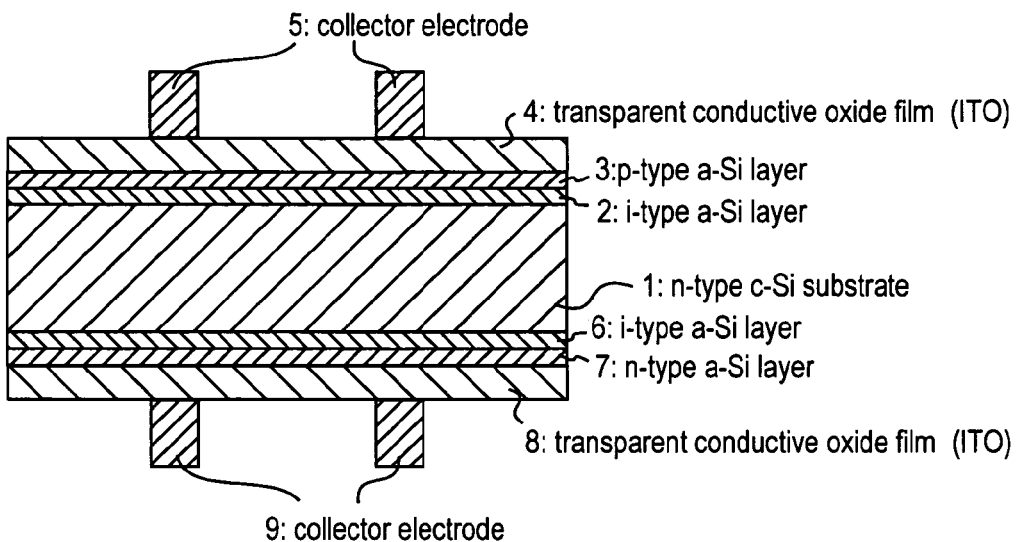
FIG. 1 is a schematic cross-sectional view showing a photovoltaic device with a H.I.T. structure to which the present invention is applied.

Descriptions will be made on embodiments according to the present invention with reference to drawings. Firstly, a photovoltaic device with the H.I.T. structure to which the present invention is applied will be described with reference to FIG. 1. FIG. 1 is a schematic cross-sectional view of a photovoltaic device with the H.I.T. structure to which the present invention is applied.

This photoelectric conversion device, as shown in FIG. 1, includes a crystalline semiconductor substrate, or an n-type single-crystal silicon (C—Si) substrate 1 (hereinafter referred to as n-type single-crystal silicon substrate 1) that has resistivity of approximately 1 Ω·cm, a thickness of approximately 300 μm, and (100) faces. On a surface of the n-type single-crystal silicon substrate 1, formed are pyramidal projections and depressions having a few micro meters to a few tens of micro meters in height in order to confine light. As a substantially intrinsic amorphous semiconductor thin-film layer containing hydrogen, a substantially intrinsic i-type amorphous silicon (a-Si:H) layer 2 having a thickness of 3 nm to 250 nm is formed on the n-type single-crystal silicon substrate 1 by an RF plasma CVD method. On the i-type amorphous silicon layer 2 formed is a p-type amorphous silicon layer 3 having a thickness of approximately 5 nm as a doped amorphous semiconductor thin-film layer containing hydrogen.

In this embodiment, an ITO (Indium Tin Oxide) film 4, as a transparent conductive oxide film having a thickness of approximately 100 nm, is formed on the p-type amorphous silicon layer 3 by a magnetron sputtering method. The ITO film 4 is made of $In_2O_3$ (indium oxides) with the addition of $SnO_2$ (tin oxides).

Comb-shaped collector electrodes 5, which are silver paste electrodes, are formed at predetermined regions on an upper surface of the ITO film 4.

In addition, a substantially intrinsic i-type amorphous silicon layer 6 having a thickness of approximately 5 nm is formed on a lower surface of the n-type single-crystal silicon substrate 1. On the i-type amorphous silicon layer 6 formed is an n-type amorphous silicon layer 7 having a thickness of approximately 20 nm. By thus forming the i-type amorphous silicon layer 6 and the n-type amorphous silicon layer 7 on the lower surface of the n-type single-crystal silicon substrate 1 in sequence, the so-called BSF (Back Surface Field) structure is formed. Furthermore, in this embodiment, an ITO film 8 is formed on the n-type amorphous silicon layer 7 by a magnetron sputtering method, as a transparent conductive oxide film having a thickness of approximately 100 nm. The ITO film 8 is made of $In_2O_3$ with the addition of $SnO_2$.

Comb-shaped collector electrodes 9, which are silver paste electrodes, are formed at predetermined regions on an upper surface of the ITO film 8.

An example of manufacturing the aforementioned photovoltaic device will be described below. A cleaned n-type single-crystal silicon substrate 1 is installed in a vacuum chamber which heats up the substrate 1 at appropriate temperatures (200 degrees centigrade or lower) to remove water adhered on the surface of the substrate as much as possible. Hydrogen gas is then supplied and plasma is discharged to clean the surface of the substrate.

A non-doped i-type amorphous silicon layer 2 is formed by supplying silane ($SiH_4$) gas and hydrogen gas. Subsequently, a p-type amorphous silicon layer 3 is formed by supplying $SiH_4$ gas, hydrogen gas and diborane ($B_2H_6$) gas functioning as a doping gas, resulting in completion of a p-n junction. In addition, an indium tin oxide layer functioning as a surface electrode 4 is formed by a sputtering method. Silver electrodes functioning as collector electrodes 5 are formed by a screen printing method. The collector electrodes 5 are completed by burning the silver electrodes.

The BSF structure may be formed by providing the non-doped i-type amorphous silicon layer 6, the n-type amorphous silicon layer 7, and the rear surface electrode layers 8 and 9 on the other surface of the substrate 1. These layers can be formed from either the rear surface side (n-type side) or the front surface side (p-type side) of the substrate.

Alternatively, a p-type substrate is also available. As in the case of the n-type substrate, a non-doped amorphous silicon layer, an n-type amorphous silicon layer, an indium tin oxide layer, and silver collector electrodes are formed on a front surface of the substrate, whereas a non-doped amorphous silicon layer, a p-type amorphous silicon layer and rear surface electrode layers are formed on a rear surface of the substrate in the same manner. Table 1 shows formation conditions of each amorphous silicon layer to form a solar cell working in a photovoltaic device.

TABLE 1

| | | conditions | | |
|---|---|---|---|---|
| process | | Substrate temperature (degrees centigrade) | gas | pressure (Pa) | power density (mW/cm$^2$) |
| front | hydro-genation | 150-180 | $H_2$: 100 sccm | 30-100 | 3-30 |
| | i-type a-Si | 150-180 | $H_2$: 0-100 sccm $SiH_4$: 40 sccm | 40-120 | 5-15 |
| | p-type a-Si | 150-180 | $H_2$: 0-100 sccm $SiH_4$: 40 sccm 2% $B_2H_6/H_2$: 20 sccm | 40-120 | 5-15 |
| rear | hydro-genation | 170 | $H_2$: 100 sccm | 50 | 3-30 |
| | i-type a-Si | 170 | $SiH_4$: 40 sccm | 40 | 8.33 |
| | p-type a-Si | 170 | $H_2$: 0-100 sccm $SiH_4$: 40 sccm 1% $PH_3/H_2$: 40 sccm | 40 | 8.33 |

As described above, in the conventional solar cell with the H.I.T. structure including an optimized p-type amorphous silicon layer 3 and i-type amorphous silicon layer 2, the i-type amorphous silicon layer 2 contains higher concentrations of hydrogen than the p-type amorphous silicon layer 3 does.

Figure 2:
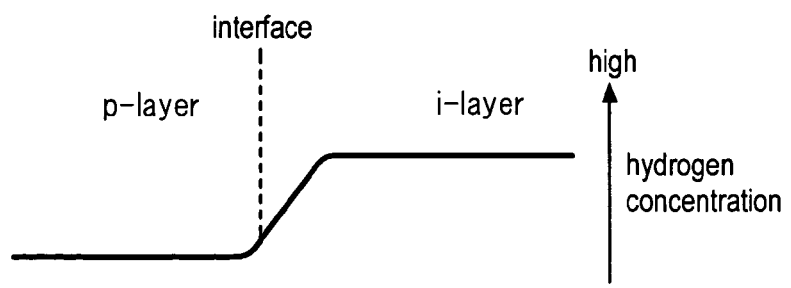
FIG. 2 is a schematic view showing a profile of hydrogen concentration in the vicinity of an interface between a p-type amorphous silicon layer and an i-type amorphous silicon layer of a conventional solar cell with the H.I.T. structure.

FIG. 2 schematically shows a profile of hydrogen concentration in the vicinity of an interface between the p-type amorphous silicon layer 3 and the i-type amorphous silicon layer 2 of the conventional solar cell with the H.I.T. structure. The hydrogen concentration of the i-type amorphous silicon layer 2 is higher than that of the p-type amorphous silicon layer 3. In the vicinity of the interface between the p-type amorphous silicon layer 3 and the i-type amorphous silicon layer 2, a negative gradient of hydrogen concentration is formed from the i-type amorphous silicon layer (i-layer) 2 toward the p-type amorphous silicon layer (p-layer) 3. Because of this, at the interface between the p-type amorphous silicon layer 3 and the i-type amorphous silicon layer 2, hydrogen in the films is prone to diffuse from the i-type amorphous silicon layer 2 to the p-type amorphous silicon layer 3 by being heated at high temperatures in the process of burning to form the collector electrodes and the process of lamination coating to modularize the solar cells.

Figure 3:
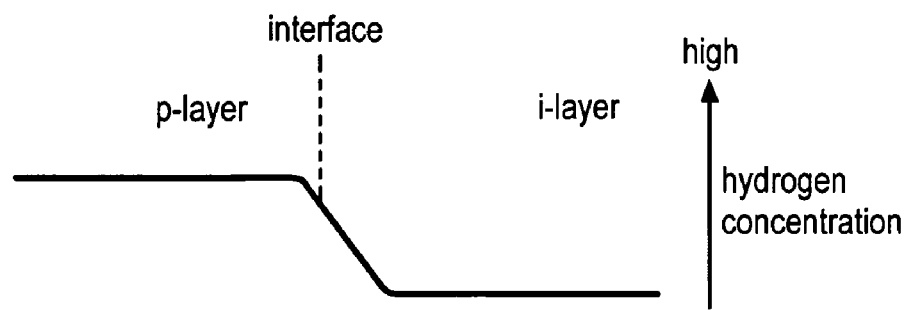
FIG. 3 is a schematic view showing a profile of hydrogen concentration in the vicinity of an interface between a p-type amorphous silicon layer and an i-type amorphous silicon layer of a solar cell with the H.I.T. structure according to the first embodiment of the present invention.

FIG. 3 schematically shows a profile of hydrogen concentration in the vicinity of the interface between the p-type amorphous silicon layer and the i-type amorphous silicon layer of the solar cell with the H.I.T. structure according to the first embodiment of the present invention. As shown in FIG. 3, contrary to the conventional solar cell, a positive gradient of hydrogen concentration is formed so as to increase the hydrogen concentration from the i-type amorphous silicon layer 2 toward the p-type amorphous silicon layer 3 in the first embodiment of the present invention. In other words, an area where hydrogen diffusion is reduced (hereinafter referred to as "hydrogen-diffusion reducing area") is formed by allowing the p-type amorphous silicon layer 3 to contain higher concentrations of hydrogen than the i-type amorphous silicon layer 2 does. Such a structure prevents hydrogen from diffusing into the p-type amorphous silicon layer 3 at some level.

In order to form the p-type amorphous silicon layer 3 containing higher concentrations of hydrogen than the i-type amorphous silicon layer 2 does, a method described below may be available.

(1) The temperature of the substrate during the formation of the p-type amorphous silicon layer 3 is set to be lower than that during the formation of the i-type amorphous silicon layer 2.

(2) The amount of hydrogen dilution during the formation of the p-type amorphous silicon layer 3 is set to be higher than that during the formation of the i-type amorphous silicon layer 2.

(3) The pressure for forming films during the formation of the p-type amorphous silicon layer 3 is set to be higher than that during the formation of the i-type amorphous silicon layer 2.

(4) The RF power applied during the formation of the p-type amorphous silicon layer 3 is set to be higher than that applied during the formation of the i-type amorphous silicon layer 2.

A solar cell according to the first embodiment was prepared with the p-type amorphous silicon layer 3 formed with more hydrogen dilution than that for the i-type amorphous silicon layer. Table 2 shows specific conditions to form the p-type amorphous silicon layer 3 and the i-type amorphous silicon layer 2 on the front surface of the substrate. Layers on the rear surface of the substrate are formed under conditions shown in Table 1. In addition, the i-type amorphous silicon layer 2 and the p-type amorphous silicon layer 3 were formed so as to have thicknesses of 10 nm and 5 nm, respectively.

TABLE 2

| | | conditions | | |
|---|---|---|---|---|
| process | | Substrate temperature (degrees centigrade) | gas | pressure (Pa) | power density (mW/cm$^2$) |
| front | hydrogenation | 170 | H$_2$: 100 sccm | 50 | 15 |
| | i-type a-Si | 170 | H$_2$: 100 sccm SiH$_4$: 40 sccm | 50 | 15 |
| | p-type a-Si | 170 | H$_2$: 400 sccm SiH$_4$: 40 sccm 2% B$_2$H$_6$/H$_2$: 20 sccm | 50 | 15 |

Figure 4:
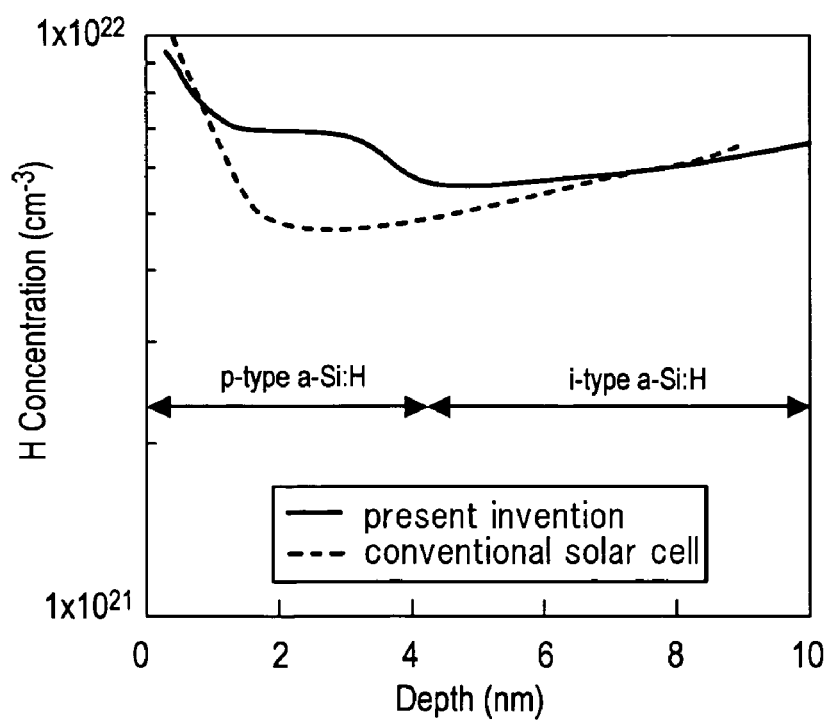
FIG. 4 shows a profile of hydrogen concentration, measured by a SIMS, at the interface between a p-type amorphous silicon layer and the i-type amorphous silicon layer of the solar cell with the H.I.T. structure according to the first embodiment.

In compliance with Table 2, the p-type amorphous silicon layer 3 was formed with more hydrogen dilution than that used to form the i-type amorphous silicon layer in order to form a solar cell of the first embodiment. The solar cell of the first embodiment according to the present invention and a conventional solar cell were prepared. FIG. 4 shows profiles of hydrogen concentrations in films measured by a Secondary Ionization Mass Spectrometer (SIMS). The conventional solar cell was manufactured under the same conditions as those of the first embodiment except for that the p-type amorphous silicon layer and the i-type amorphous silicon layer were formed with same amounts of hydrogen dilution. FIG. 4 shows profiles of hydrogen concentration, measured by the SIMS, at an interface between the p-type amorphous silicon layer 3 and the i-type amorphous silicon layer 2 of the solar cell with the H.I.T. structure according to the first embodiment.

Descriptions will be made on the SIMS in use and the measurement conditions of hydrogen (H). In the measurement, cesium positive ions (Cs$^+$) were irradiated at the samples to sputter off hydrogen negative ions (H$^-$) and silicon negative ions (Si$^-$). The number of secondary ions of each of the negative ions was counted. The hydrogen concentration was quantified by [H$^-$]/[Si$^-$]. However, the silicon concentration was 5.0×10$^{22}$/cm$^3$. The measuring device in use was ADEPT 1010 by ULVAC-PHI, Inc in Japan. Ion beam energy was 1 keV.

The profile of the hydrogen concentration measured by the SIMS shown in FIG. 4 indicates the same profile of the hydrogen concentration as those shown in the schematic views in FIG. 2 and FIG. 3. Specifically, the solar cell of the first embodiment has a positive gradient of hydrogen concentration from the i-type amorphous silicon layer 2 toward the p-type amorphous silicon layer 3. It is apparent that the p-type amorphous silicon layer 3 contains more hydrogen than the i-type amorphous silicon layer 2 does.

Since the p-type amorphous silicon layer 3 functioning as a window layer on the light incident side has a high concentration of hydrogen, the first embodiment has, in addition to an effect of preventing hydrogen diffusion, an effect of generating more electric current due to less light absorption loss at the p-type amorphous silicon layer 3.

Figure 5:
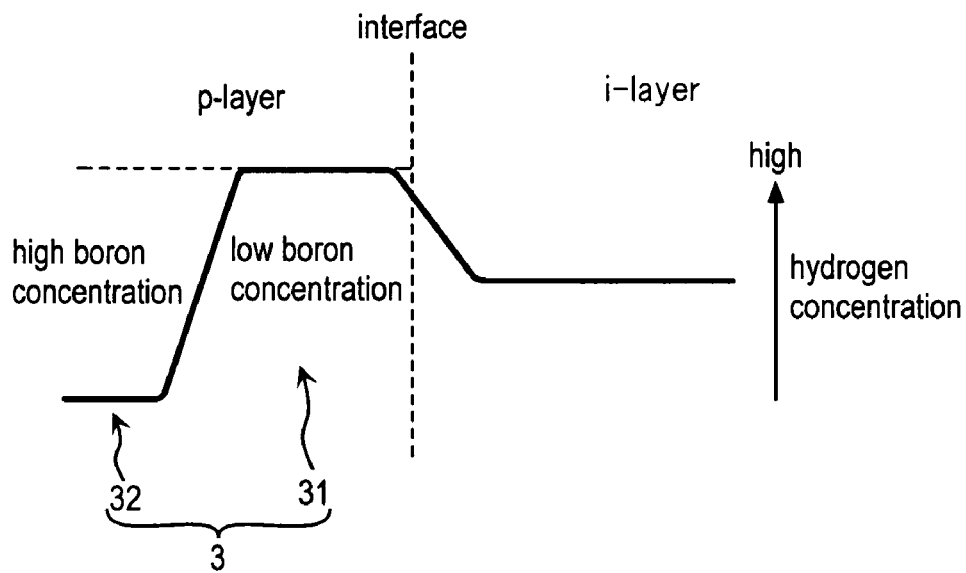
FIG. 5 is a schematic view showing a profile of hydrogen concentration in the vicinity of an interface between a p-type amorphous silicon layers and an i-type amorphous silicon layer of a solar cell with the H.I.T. structure according to the second embodiment of the present invention.

Next description will be made on the second embodiment of the present invention with reference to FIGS. 5 and 6. FIG. 5 schematically shows a profile of hydrogen concentration in the vicinity of an interface between a p-type amorphous silicon layer and an i-type amorphous silicon layer of a solar cell having the H.I.T. structure according to the second embodiment of the present invention.

As shown in FIG. 5, the p-type amorphous silicon layer 3 of the second embodiment has a different composition. While the hydrogen concentration is set to be high throughout the entire p-type amorphous silicon layer 3 in the first embodiment, only a front half 31, which is closer to the i-type amorphous silicon layer 2, of the p-type amorphous silicon layer 3 in the second embodiment contains hydrogen in high concentrations. The hydrogen concentration of a rear half 32 is set to the same hydrogen concentration as that of the conventional device.

The structure of the second embodiment will be more effective when the front half of the p-type amorphous silicon layer 31 is doped with boron (B) in relatively small concentrations (<1.0 at. %) and the rear half 32 is doped with boron (B) in relatively large concentrations (>2.0 at. %). The structure of the second embodiment, similar to the first embodiment, can reduce hydrogen diffusion from the i-type amorphous silicon layer to the p-type amorphous silicon layer, but hydrogen still diffuses from the front half of the p-type amorphous silicon layer 31 to the rear half of the amorphous silicon layer 32. However, since the rear half of the amorphous silicon layer 32 contains high concentrations of boron (B), even if boron partially becomes inactive by a trace amount of hydrogen diffusion, the device characteristics will not be affected so much.

Table 3 shows formation conditions of the second embodiment. As appreciated from Table 3, the p-type amorphous silicon layer 31 and the p-type amorphous silicon layer 32 were formed with different flow rates of $B_2H_6$. More amount of $B_2H_6$ flow was used for the p-type amorphous silicon layer 32 than that for the p-type amorphous silicon layer 31, while more amount of the hydrogen dilution was used for the p-type amorphous silicon layer 31. Layers on the rear surface of the substrate were formed under the conditions shown in Table 1. The i-type amorphous silicon layer 2 was formed to have a thickness of 10 nm, while the p-type amorphous silicon layers 31 and 32 have a thickness of 4 nm each.

TABLE 3

| | | conditions | | | |
|---|---|---|---|---|---|
| process | | Substrate temperature (degrees centigrade) | gas | pressure (Pa) | Power Density (mW/cm$^2$) |
| front | hydrogenation | 170 | H$_2$: 100 sccm | 50 | 15 |
| | i-type a-Si | 170 | H$_2$: 100 sccm SiH$_4$: 40 sccm | 50 | 15 |
| | p-type a-Si (31) | 170 | H$_2$: 400 sccm SiH$_4$: 20 sccm B$_2$H$_6$: 10 sccm | 50 | 15 |
| | p-type a-Si (32) | 170 | H$_2$: 100 sccm SiH$_4$: 40 sccm 2% B$_2$H$_6$/H$_2$: 40 sccm | 50 | 15 |

After the preparation of the solar cell according to the second embodiment and a conventional solar cell, their profiles of hydrogen concentrations in films were measured by the SIMS. FIG. 6 shows the results. FIG. 6 shows profiles of hydrogen concentrations, measured by the SIMS, at interfaces of p-type amorphous silicon layers 31 and 32 and an i-type amorphous silicon layer 2 of a solar cell with the H.I.T. structure according to the second embodiment. Measurement conditions are the same as those for the first embodiment.

Figure 6:
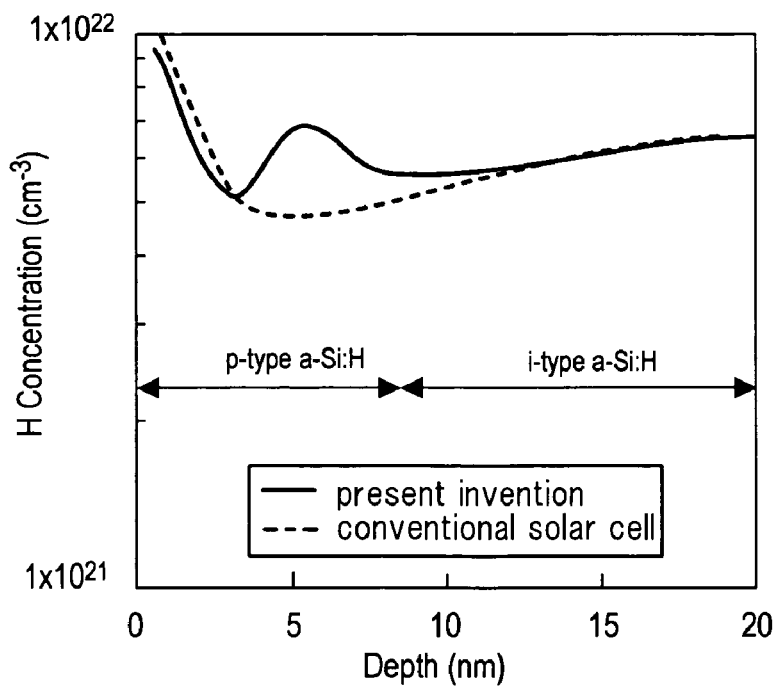
FIG. 6 shows a profile of hydrogen concentration, measured by the SIMS, at the interface between the p-type amorphous silicon layers and the i-type amorphous silicon layer of the solar cell with the H.I.T. structure according to the second embodiment.

It is recognized that the profile of the hydrogen concentration measured by the SIMS shown in FIG. 6 is similar to the profiles of the hydrogen concentrations shown in FIG. 2 and FIG. 5. It is therefore found that only front half 31, which is closer to the i-type amorphous silicon layer, of the p-type amorphous silicon layer contains high hydrogen concentration, whereas the rear half 32 is controlled so as to have a gradient of hydrogen concentration equivalent to that of the conventional photovoltaic device.

Figure 7:
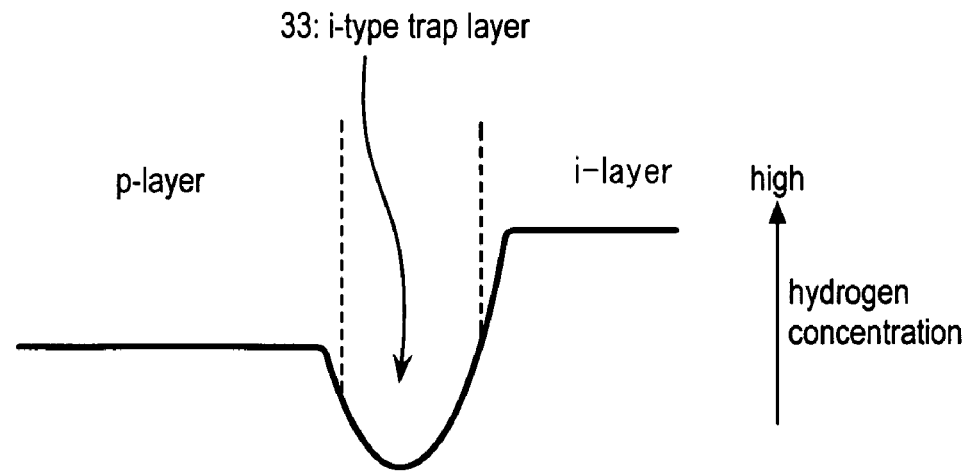
FIG. 7 is a schematic view showing a profile of hydrogen concentration in the vicinity of an interface between a p-type amorphous silicon layer and an i-type amorphous silicon layer of a solar cell with the H.I.T. structure according to the third embodiment of the present invention.

Next description will be made on the third embodiment of the present invention with reference to FIGS. 7 and 8. FIG. 7 schematically shows a profile of hydrogen concentration in the vicinity of an interface between a p-type amorphous silicon layer and an i-type amorphous silicon layer of a solar cell with the HIT structure according to the third embodiment of the present invention.

In the third embodiment, an i-type trap layer 33, which has a thickness of approximately 2 nm and low hydrogen concentrations, is disposed in the vicinity of the interface between the p-type amorphous silicon layer 3 and the i-type amorphous silicon layer 2. The i-type trap layer 33 functions as a hydrogen-diffusion reducing area. In the third embodiment, hydrogen diffuses from the i-type amorphous silicon layer 2 to the i-type trap layer 33, but has no influence on the p-type amorphous silicon layer.

The formation conditions of the third embodiment are shown in Table 4. Layers on the rear surface of the substrate were formed under the conditions shown in Table 1. The thickness of the i-type amorphous silicon layer 2 including the i-type trap layer 33 is 10 nm, (i-type trap layer 33 has a thickness of 2 nm alone). The p-type amorphous silicon layer 3 has a thickness of 8 nm.

TABLE 4

| | | conditions | | | |
|---|---|---|---|---|---|
| process | | Substrate temperature (degrees centigrade) | gas | pressure (Pa) | Power density (mW/cm$^2$) |
| front | hydrogenation | 170 | H$_2$: 100 sccm | 50 | 15 |
| | i-type a-Si | 170 | H$_2$: 100 sccm SiH$_4$: 40 sccm | 50 | 15 |
| | i-type a-Si trap layer (33) | 170 | SiH$_4$: 40 sccm | 50 | 15 |
| | p-type a-Si | 170 | H$_2$: 100 sccm SiH$_4$: 40 sccm 2% B$_2$H$_6$/H$_2$: 40 sccm | 50 | 15 |

In the third embodiment, no hydrogen dilution was used to form the i-type trap layer 33 in order to make the hydrogen concentration in the i-type trap layer 33 lower than that in the i-type amorphous silicon layer. There are some other ways as indicated below.

(1) The temperature of the substrate during the formation of the p-type amorphous silicon layer is set to be higher than that during the formation of the i-type amorphous silicon layer.

(2) The amount of hydrogen dilution during the formation of the p-type amorphous silicon layer is set to be lower than that during the formation of the i-type amorphous silicon layer.

(3) The pressure during the formation of the p-type amorphous silicon layer is set to be lower than that during the formation of the i-type amorphous silicon layer.

(4) The RF power applied during the formation of the p-type amorphous silicon layer is set to be lower than that applied during the formation of the i-type amorphous silicon layer.

Figure 8:
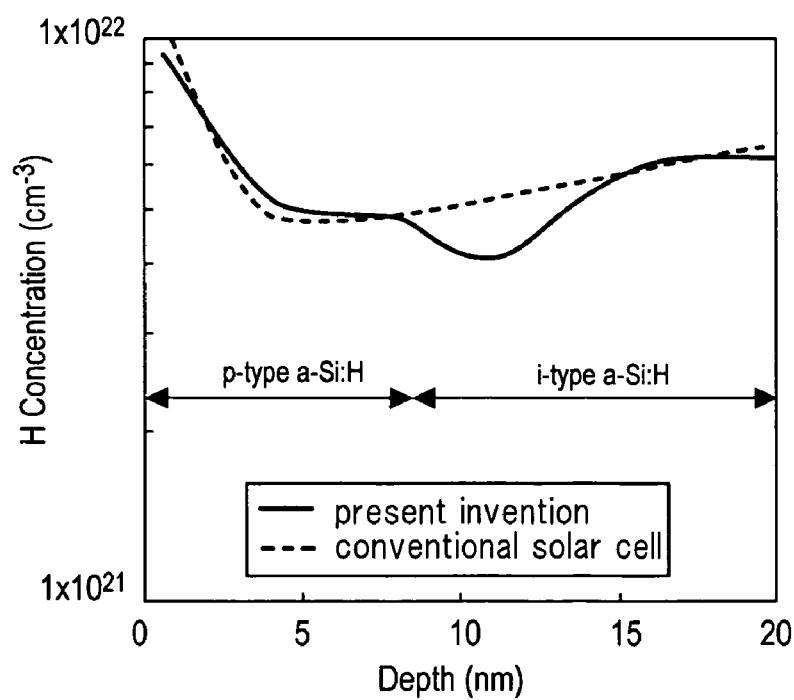
FIG. 8 shows a profile of hydrogen concentration, measured by the SIMS, at the interface between the p-type amorphous silicon layer and the i-type amorphous silicon layer of the solar cell with the H.I.T. structure according to the third embodiment.

FIG. 8 shows profiles of hydrogen concentrations, measured by the SIMS, in films of a solar cell according to the third embodiment and a conventional solar cell. FIG. 8 shows profiles of hydrogen concentration, measured by the SIMS, at interfaces of the p-type amorphous silicon layer 3, the i-type trap layer 33 and the i-type amorphous silicon layer 2 of the solar cell with the H.I.T. structure according to the third embodiment. Measurement conditions are the same as those for the first embodiment.

It is recognized that the profile of the hydrogen concentration measured by the SIMS shown in FIG. 8 is similar to the profiles of the hydrogen concentrations shown in FIGS. 2 and 7. It is therefore found that the trap layer 33 can capture hydrogen diffused from the i-type amorphous silicon layer 2.

Figure 9:
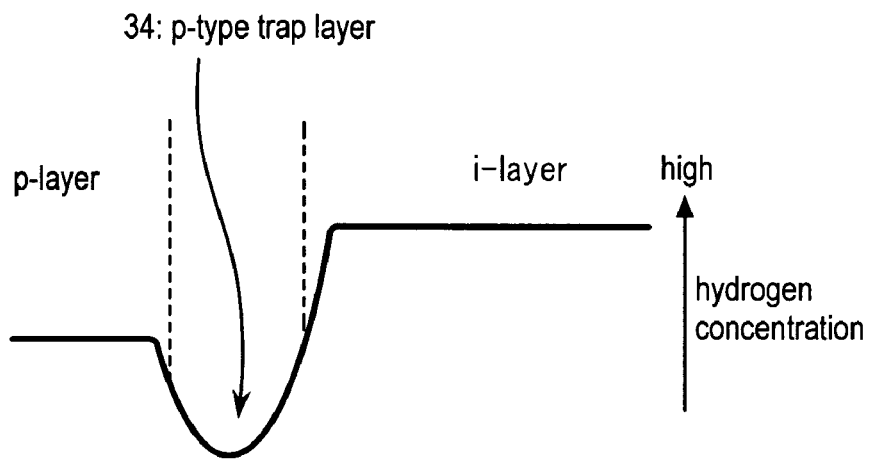
FIG. 9 is a schematic view showing a profile of hydrogen concentration in the vicinity of an interface between a p-type amorphous silicon layer and an i-type amorphous silicon layer of a solar cell with the H.I.T. structure according to the fourth embodiment of the present invention.

Next description will be made on the fourth embodiment of the present invention with reference to FIGS. 9 and 10. FIG. 9 shows a profile of hydrogen concentration in the vicinity of an interface between a p-type amorphous silicon layer and an i-type amorphous silicon layer of a solar cell with the H.I.T. structure according to the fourth embodiment of the present invention.

Hydrogen concentration of the i-type amorphous silicon layer 2 in the vicinity of the interface between the p-type amorphous silicon layer 3 and the i-type amorphous silicon layer 2 have an influence on the voltage generated in the H.I.T. solar cell. It has been known that output voltage can be improved by making hydrogen concentration in the rear half (near the p-type amorphous silicon layer) of the i-type amorphous silicon layer 2 high. The solar cell according to the aforementioned third embodiment, which is structured in the opposite manner, reduces hydrogen diffusion toward the p-type amorphous silicon layer 3, but decreases its output voltage to some extent. Thus, in the fourth embodiment, boron (B) is doped into the trap layer 34 having a thickness of approximately 2 nm. This can reduce hydrogen diffusion toward the p-type amorphous silicon layer 3 without reduction of output voltages.

The formation conditions of the fourth embodiment are shown in Table 5. Layers on the rear surface of the substrate were formed under the conditions shown in Table 1. The thickness of the i-type amorphous silicon layer 2 is 10 nm, while the trap layer 34 has a thickness of 0.5 nm. The p-type amorphous silicon layer 3 is formed to have a thickness of 6 nm.

TABLE 5

| | conditions | | | |
|---|---|---|---|---|
| process | Substrate temperature (degrees centigrade) | gas | pressure (Pa) | Power density (mW/cm$^2$) |
| front hydrogenation | 170 | H$_2$: 100 sccm | 50 | 15 |
| i-type a-Si | 170 | H$_2$: 100 sccm SiH$_4$: 40 sccm | 50 | 15 |
| trap layer (34) | 170 | SiH$_4$: 40 sccm 2% B$_2$H$_6$/H$_2$: 10 sccm | 50 | 15 |
| p-type a-Si | 170 | H$_2$: 100 sccm SiH$_4$: 40 sccm 2% B$_2$H$_6$/H$_2$: 40 sccm | 50 | 15 |

After the preparation of a solar cell according to the fourth embodiment and a conventional solar cell, their profiles of hydrogen concentrations in films were measured by the SIMS. FIG. 10 shows the results. FIG. 10 shows the profiles of hydrogen concentrations, measured by the SIMS, at interfaces of the p-type amorphous silicon layers 3, the trap layer 34 and the i-type amorphous silicon layer 2 of the solar cell with the H.I.T. structure according to the fourth embodiment. Measurement conditions are the same as those for the first embodiment.

Figure 10:
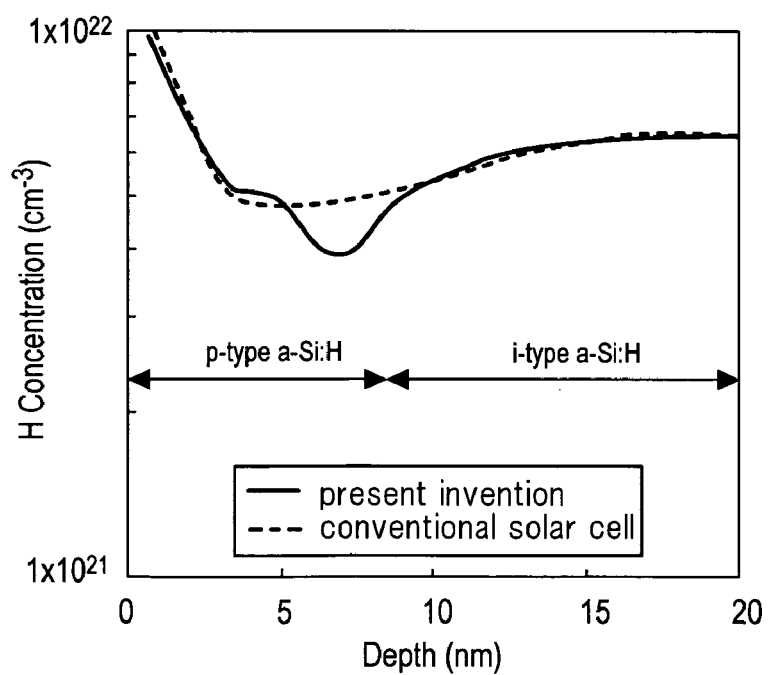
FIG. 10 shows a profile of hydrogen concentration, measured by the SIMS, at the interface between the p-type amorphous silicon layer and the i-type amorphous silicon layer of the solar cell with the H.I.T. structure according to the fourth embodiment.

It is recognized that the profile of the hydrogen concentration, measured by the SIMS shown in FIG. 10, is similar to the profiles of the hydrogen concentrations shown in FIGS. 2 and 9. It is therefore found that the trap layer 34 can capture hydrogen diffused from the i-type amorphous silicon layer 2.

Then solar cell device having the H.I.T. structure according to the first to fourth embodiments of the present invention and a conventional solar cell device were prepared and thermal-annealed at 250 degrees centigrade in the atmosphere for three hours. Table 6 shows measurement results of the characteristics changes.

TABLE 6

| | | Voc (V) | Isc (A/cm$^2$) | F.F. | Pmax (W) |
|---|---|---|---|---|---|
| Conventional technology | Initial characteristics | 0.706 | 3.820 | 0.772 | 2.082 |
| | Post-annealing characteristics | 0.684 | 3.811 | 0.753 | 1.963 |
| | Rate of change | −3.12% | −0.24% | −2.46% | −5.72% |
| First embodiment | Initial characteristics | 0.709 | 3.880 | 0.762 | 2.096 |
| | Post-annealing characteristics | 0.700 | 3.869 | 0.752 | 2.037 |
| | Rate of change | −1.27% | −0.28% | −1.31% | −2.84% |
| Second embodiment | Initial characteristics | 0.707 | 3.850 | 0.769 | 2.090 |
| | Post-annealing characteristics | 0.699 | 3.835 | 0.758 | 2.032 |
| | Rate of change | −1.13% | −0.39% | −1.43% | −2.78% |
| Third embodiment | Initial characteristics | 0.698 | 3.810 | 0.760 | 2.020 |
| | Post-annealing characteristics | 0.691 | 3.796 | 0.751 | 1.970 |
| | Rate of change | −1.00% | −0.37% | −1.18% | −2.48% |
| Fourth embodiment | Initial characteristics | 0.707 | 3.790 | 0.775 | 2.080 |
| | Post-annealing characteristics | 0.701 | 3.783 | 0.767 | 2.034 |
| | Rate of change | −0.85% | −0.18% | −1.03% | −2.21% |

As appreciated from Table 6, it is confirmed that deterioration in output characteristics caused by being heated at high temperatures can be significantly reduced by providing the hydrogen-diffusion reducing area between the p-type amorphous silicon layer and the i-type amorphous silicon layer as in the first to fourth embodiments of the present invention. Because of this, the collector electrodes can be made of materials requiring to be burned at high-temperatures, thereby reducing electrode resistance.

Figure 11:
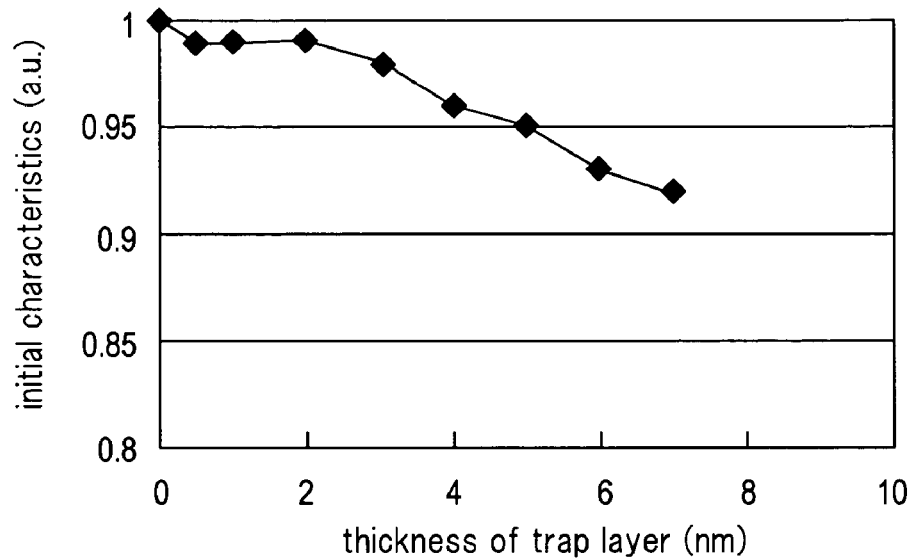
FIG. 11 is a characteristic diagram showing the relationship between film thicknesses and initial characteristics of a trap layer according to the third embodiment of the present invention.
Figure 12:
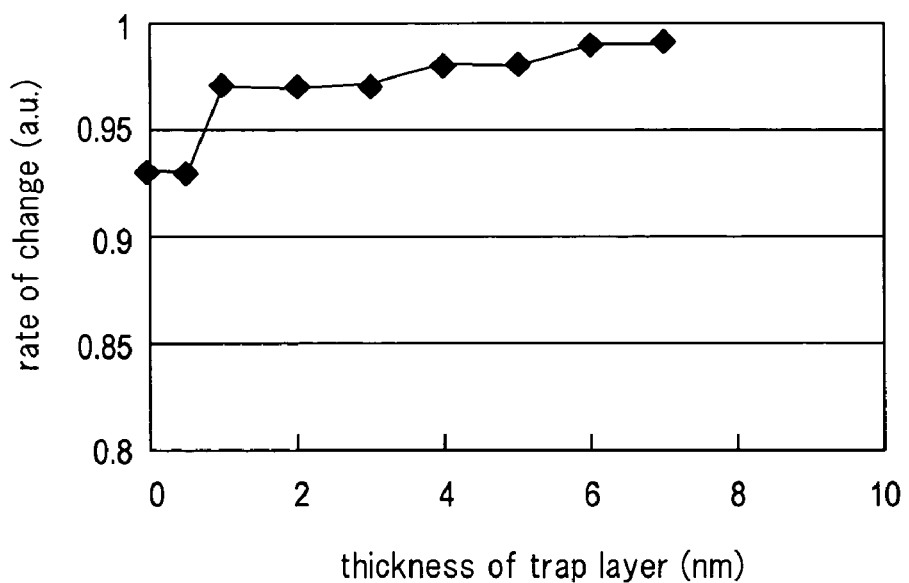
FIG. 12 is a characteristic diagram showing the relationship between relative outputs and film thicknesses of the trap layer according to the third embodiment of the present invention. The relative outputs, which are expressed as rate of change, are obtained from post-annealing characteristics and the initial characteristics.
Figure 13:
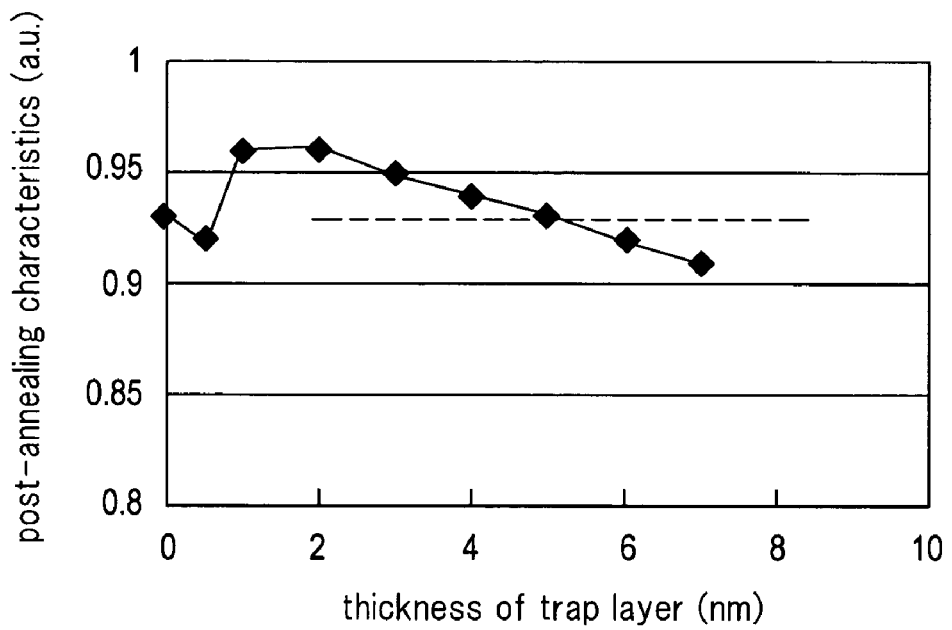
FIG. 13 is a characteristic diagram showing the relationship between the post-annealing characteristics and the thicknesses of the trap layer according to the third embodiment of the present invention.

Next, an examination was done on variation in characteristics when the thicknesses of the trap layer 33 and the trap layer 34 were changed. Firstly solar cell devices having i-type trap layers 33, according to the third embodiment, with different thicknesses were prepared as samples. The samples were made under the aforementioned conditions except for that the thicknesses of the i-type trap layers 33 were changed. Then, each sample was thermal-annealed in the atmosphere at 250 degrees centigrade for 3 hours, and examined for its initial characteristics, rate of change, post-annealing characteristics. The results are shown in Table 7 and FIGS. 11 to 13. The characteristics are standardized with respect to the output of the conventional solar cell device without the trap layer 33, that is, the output of the conventional solar device is defined as 1. FIG. 11 is a characteristic diagram showing the relationship between film thicknesses and initial characteristics. FIG. 12 is a characteristic diagram showing the relationship between relative outputs and film thicknesses. The relative outputs, which are expressed as rate of change, are obtained from post-annealing characteristics and the initial characteristics. FIG. 13 is a characteristic diagram showing the relationship between the post-annealing characteristics and the film thicknesses.

TABLE 7

| Film thickness (nm) | Initial characteristics | Rate of change | Post-annealing characteristics |
|---|---|---|---|
| 0 | 1 | 0.93 | 0.930 |
| 0.5 | 0.99 | 0.93 | 0.921 |
| 1.0 | 0.99 | 0.97 | 0.960 |
| 2.0 | 0.99 | 0.97 | 0.960 |
| 3.0 | 0.98 | 0.97 | 0.951 |
| 4.0 | 0.96 | 0.98 | 0.941 |
| 5.0 | 0.95 | 0.98 | 0.931 |
| 6.0 | 0.93 | 0.99 | 0.921 |
| 7.0 | 0.92 | 0.99 | 0.911 |

From Table 6 and FIGS. 11 to 13, it is found that in the case of providing the i-type trap layer 33, the solar cell devices having the i-type trap layers 33 with thicknesses ranging from 1 nm to 5nm improved their output characteristics after annealing. Thus, the thickness of the i-type trap layer 33 should be 1 nm to 5 nm, more preferably 1 nm to 2 nm. For your information, film-forming time was obtained in advance by calculating from a film with a certain thickness and time elapsed to form the film. The i-type trap layer of each sample was formed based on the film-forming time.

Figure 14:
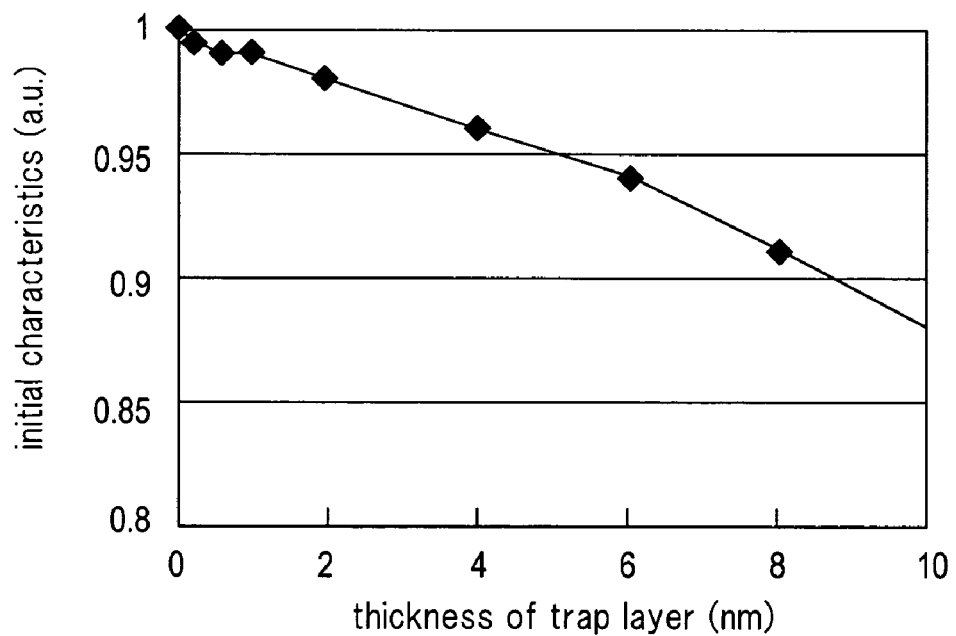
FIG. 14 is a characteristic diagram showing the relationship between film thicknesses and initial characteristics of a trap layer according to the fourth embodiment of the present invention.
Figure 15:
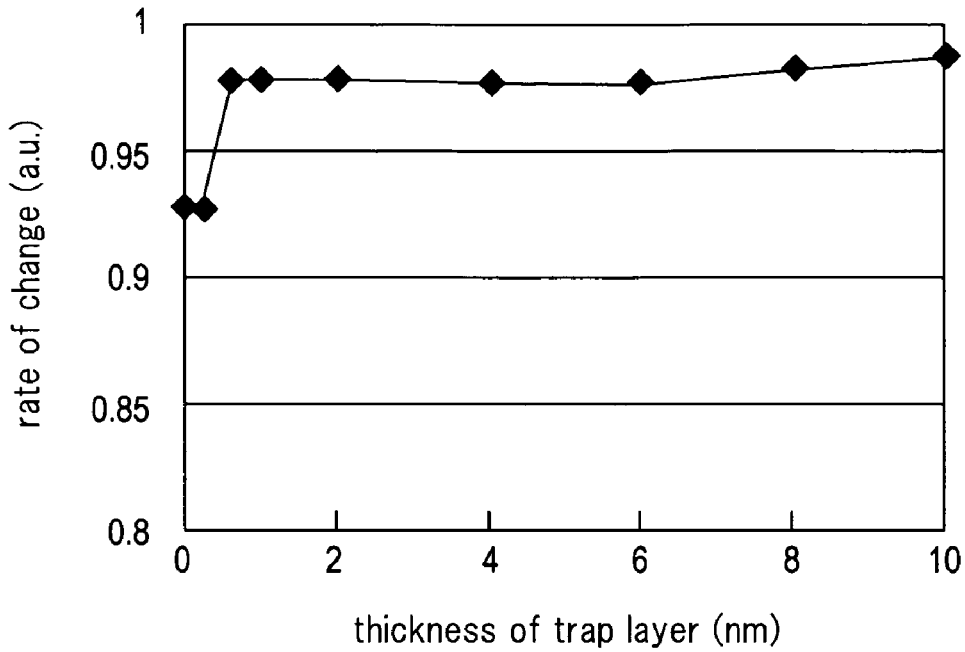
FIG. 15 is a characteristic diagram showing the relationship between relative outputs and film thicknesses of the trap layer according to the fourth embodiment of the present invention. The relative outputs, which are expressed as rate of change, are obtained from post-annealing characteristics and the initial characteristics.
Figure 16:
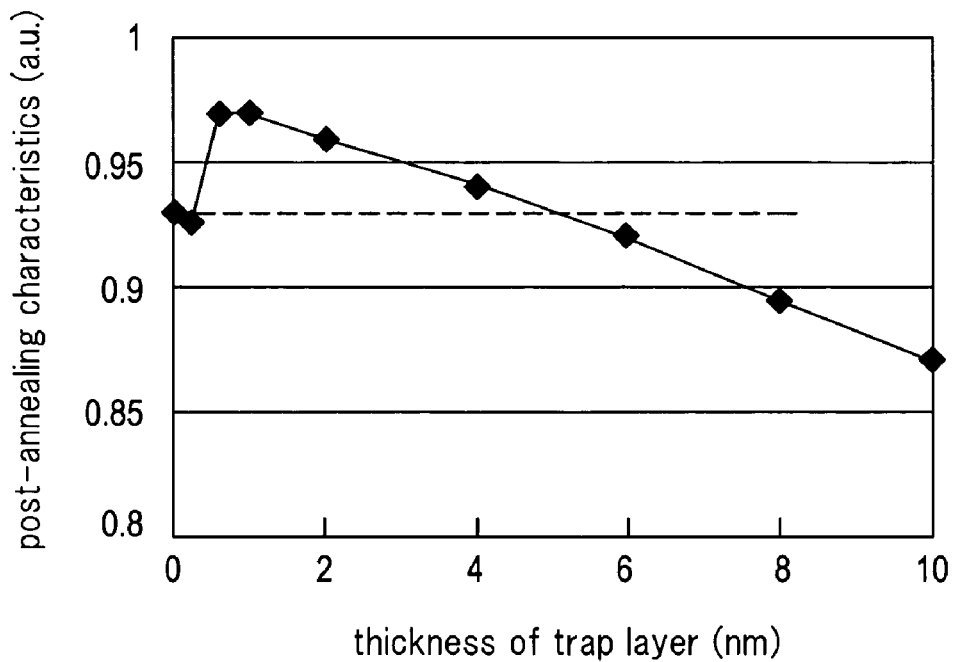
FIG. 16 is a characteristic diagram showing the relationship between the post-annealing characteristics and the thicknesses of the trap layer according to the fourth embodiment of the present invention.

Next, solar cell devices having trap layers 34 doped with boron (B), according to the fourth embodiment, with different thicknesses were prepared as samples. The samples were made under the aforementioned conditions except for that the thicknesses of the trap layers 34 were changed. Then, each sample was thermal-annealed in the atmosphere at 250 degrees centigrade for 3 hours, and examined for its initial characteristics, rate of change, post-annealing characteristics. The results are shown in Table 8 and FIGS. 14 to 16. The characteristics are standardized with respect to the output of the conventional solar cell device without the trap layer 34, that is, the output of the conventional solar device is defined as 1. FIG. 14 is a characteristic diagram showing the relationship between film thicknesses and initial characteristics. FIG. 15 is a characteristic diagram showing the relationship between relative outputs and film thicknesses. The relative outputs, which are expressed as rate of change, are obtained from post-annealing characteristics and the initial characteristics. FIG. 16 is a characteristic diagram showing the relationship between the post-annealing characteristics and the film thicknesses.

TABLE 8

| Film thickness (nm) | Initial characteristics | rate of change | Post-annealing characteristics |
|---|---|---|---|
| 0 | 1 | 0.93 | 0.930 |
| 0.1 | 0.995 | 0.93 | 0.925 |
| 0.3 | 0.990 | 0.98 | 0.970 |
| 0.5 | 0.990 | 0.98 | 0.970 |
| 1.0 | 0.980 | 0.98 | 0.960 |
| 2.0 | 0.960 | 0.98 | 0.941 |
| 3.0 | 0.940 | 0.98 | 0.921 |
| 4.0 | 0.910 | 0.985 | 0.896 |

TABLE 8-continued

| Film thickness (nm) | Initial characteristics | rate of change | Post-annealing characteristics |
|---|---|---|---|
| 5.0 | 0.880 | 0.99 | 0.871 |

From Table 8 and FIGS. 14 to 16, it is found that in the case of providing the trap layer 34, the solar cell devices having the trap layers 34 with thicknesses of 0.1 nm or more but less than 3 nm improved their output characteristics after annealing. Furthermore, the trap layers 34 with thicknesses ranging from 0.3 nm to 2 nm further improved their output characteristics. Thus, the thickness of the trap layer 34 should be 0. 1 nm or more but less than 3 nm, more preferably 0.3 nm to 2 nm. For your information, film-forming time was obtained by calculating from a film with a certain thickness and time elapsed to form the film. The i-type trap layer of each sample was formed based on the film-forming time.

In the above-mentioned embodiments, although a single-crystal silicon substrate was used as a crystalline semiconductor substrate, multicrystailine semiconductor substrates such as a multicrystalline silicon substrate can obtain same effect. In the above-mentioned embodiments, although an amorphous silicon layer was used as an amorphous semiconductor film containing hydrogen, the present invention is not limited to this. Same effect can be obtained by using amorphous silicon carbide, amorphous silicon germanium, amorphous silicon base alloy, and semiconductor films including minute crystal grains.

It should be understood that the embodiments disclosed herein are to be taken as examples and not limited. The scope of the present invention is defined not by the above described embodiments but by the following claims. All changes that fall within meets and bounds of the claims, or equivalence of such meets and bounds are intended to embraced by the claims.

I claim:
1. A photovoltaic device comprising:
a single-crystal substrate;
a substantially intrinsic amorphous semiconductor thin-film layer containing hydrogen and provided on the single-crystal substrate;
a doped amorphous semiconductor thin-film layer having a first and second region, the doped amorphous semiconductor thin-film layer containing hydrogen and provided on the intrinsic amorphous semiconductor thin-film layer; and
a hydrogen-diffusion reducing area provided between the doped amorphous semiconductor thin-film layer and the intrinsic amorphous semiconductor thin-film layer, the hydrogen-diffusion reducing area reducing hydrogen diffusion from the intrinsic amorphous semiconductor thin-film layer to the doped amorphous semiconductor thin-film layer, wherein:
the hydrogen-diffusion reducing area is an area formed in the vicinity of the interface between the doped amorphous semiconductor thin-film layer and the intrinsic amorphous semiconductor thin-film layer, the hydrogen-diffusion reducing area containing a higher concentration of hydrogen than that of the intrinsic amorphous semiconductor thin-film layer, and being doped with the same impurity as that for the doped amorphous semiconductor thin-film layer,
the doped amorphous semiconductor thin-film layer includes a positive gradient of hydrogen concentration from the first region to the second region, the second region being closer to the intrinsic amorphous semiconductor thin-film layer than the first region, a concentration of the doped impurity in the hydrogen-diffusion reducing area is lower than that in the doped amorphous semiconductor thin-film layer, a concentration of the doped impurity in the first region of the doped amorphous semiconductor thin-film layer is higher than the concentration of the doped impurity in the second region of the doped amorphous semiconductor thin-film layer, and the concentration of hydrogen in the hydrogen-diffusion reducing area is more than that in the first region of the doped amorphous semiconductor thin-film layer and the intrinsic amorphous semiconductor thin-film layer.

2. A photovoltaic device comprising:

an n-type single-crystal silicon substrate;

a substantially intrinsic amorphous silicon layer containing hydrogen and provided on the single-crystal silicon substrate;

a p-type amorphous silicon layer having a first and second region, the p-type amorphous silicon layer containing hydrogen and provided on the intrinsic amorphous silicon layer; and a hydrogen-diffusion reducing area provided between the p-type amorphous silicon layer and the intrinsic amorphous silicon layer and reducing hydrogen diffusion from the intrinsic amorphous silicon layer to the p-type amorphous silicon layer, wherein:

the hydrogen-diffusion reducing area is an area formed in the vicinity of the interface between the p-type amorphous silicon layer and the intrinsic amorphous silicon layer, the hydrogen-diffusion reducing area containing a higher concentration of hydrogen than that of the intrinsic amorphous silicon layer, and being doped with a p-type impurity, the p-type amorphous silicon layer includes a positive gradient of hydrogen concentration from the first region to the second region, the second region being closer to the substantially intrinsic amorphous silicon layer than the first region, a concentration of the p-type impurity in the hydrogen-diffusion reducing area is lower than that in the p-type amorphous silicon layer, a concentration of the doped impurity in the first region of the p-type amorphous silicon layer is higher than the concentration of the doped impurity in the second region of the p-type amorphous silicon layer, and the concentration of hydrogen in the hydrogen-diffusion reducing area is more than that in the first region of the p-type amorphous silicon layer and the substantially intrinsic amorphous silicon layer.

3. The photovoltaic device according to claim 2, wherein the p-type impurity is boron (B), and a concentration of boron (B) in the p-type amorphous silicon layer is greater than 2.0 at. %, and a concentrations of boron (B) in the hydrogen-diffusion reducing area is smaller than 1.0 at. %.

* * * * *